(12) United States Patent
Shum

(10) Patent No.: US 6,407,854 B1
(45) Date of Patent: Jun. 18, 2002

(54) FIBER AMPLIFIER WITH FAST TRANSIENT RESPONSE AND CONSTANT GAIN

(75) Inventor: Frank Shum, Sunnyvale, CA (US)

(73) Assignee: Ditech Corporation, Mountain View, CA (US)

( * ) Notice: Subject to any disclaimer, the term of this patent is extended or adjusted under 35 U.S.C. 154(b) by 0 days.

(21) Appl. No.: 09/519,157

(22) Filed: Mar. 6, 2000

(51) Int. Cl.[7] .............................................. H01S 3/00
(52) U.S. Cl. .............................. 359/341.41; 359/337.11
(58) Field of Search ..................... 359/337.11, 341.41

(56) References Cited

U.S. PATENT DOCUMENTS 5,822,112 A * 10/1998 Itou et al. ................... 359/341
6,219,177 B1 * 4/2001 Tamura ....................... 359/341

FOREIGN PATENT DOCUMENTS

| EP | 1 079 481 A2 | 2/2001 |
| WO | WO98/11682 | 3/1998 |
| WO | WO00/04656 | 1/2000 |

* cited by examiner

Primary Examiner—Mark Hellner
(74) Attorney, Agent, or Firm—R. Michael Ananian; Flehr Hohbach Test

(57) ABSTRACT

An apparatus and method are provided for amplifying a signal having several multiplexed channels of different wavelengths. In one embodiment, an amplifier 100 is provided having a doped fiber 120 coupled to an input 105, a pump 145 coupled to the doped fiber to provide an output to amplify the signal therein and a control system 130 for controlling the pump. The control system 130 has a detector 170 for measuring power of the signal and a controller 180 for adjusting power to the pump 145 based on predetermined criteria and the measured signal power. The pump power is adjusted as a linear function of the signal power by including within the predetermined criteria a multiplier by which the signal power is multiplied, and an offset that is added to the product of the multiplier and the signal power to ensure that the power applied to the pump 145 is non-zero even for zero signal power. Preferably, the controller 180 can automatically adjust pump power to provide equal and constant gain to each channel even when channels are added or removed. More preferably, the controller 180 can provide a transient response of less than 200µs when channels are added or removed.

20 Claims, 4 Drawing Sheets

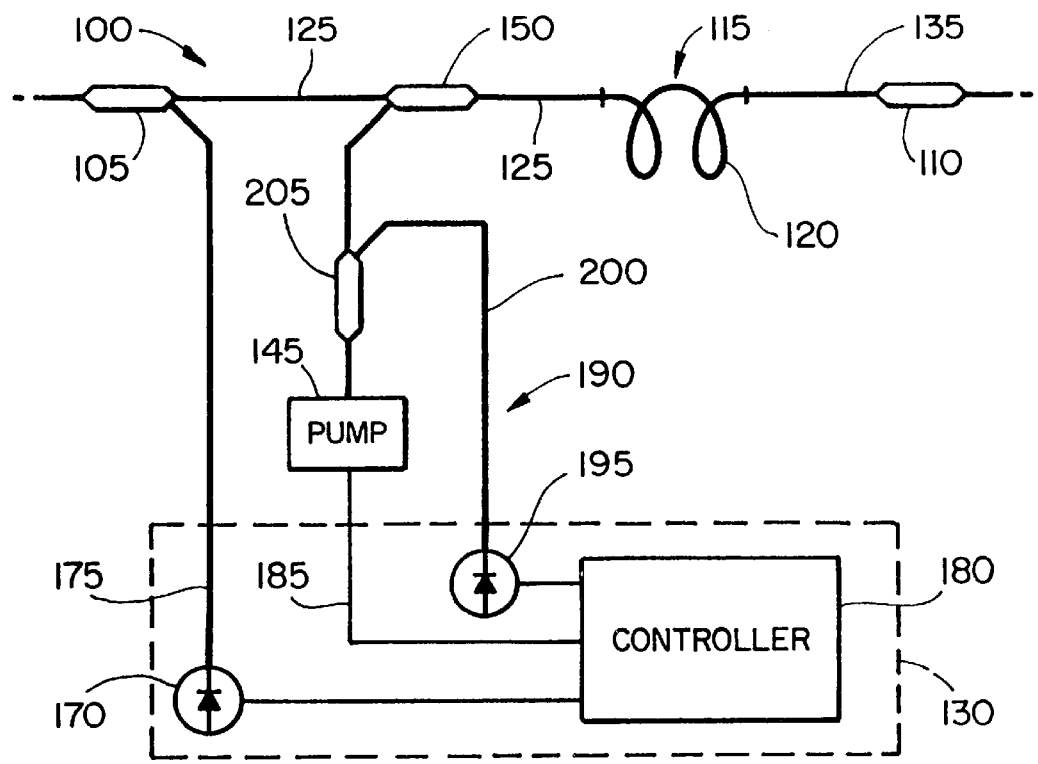
FIG_1
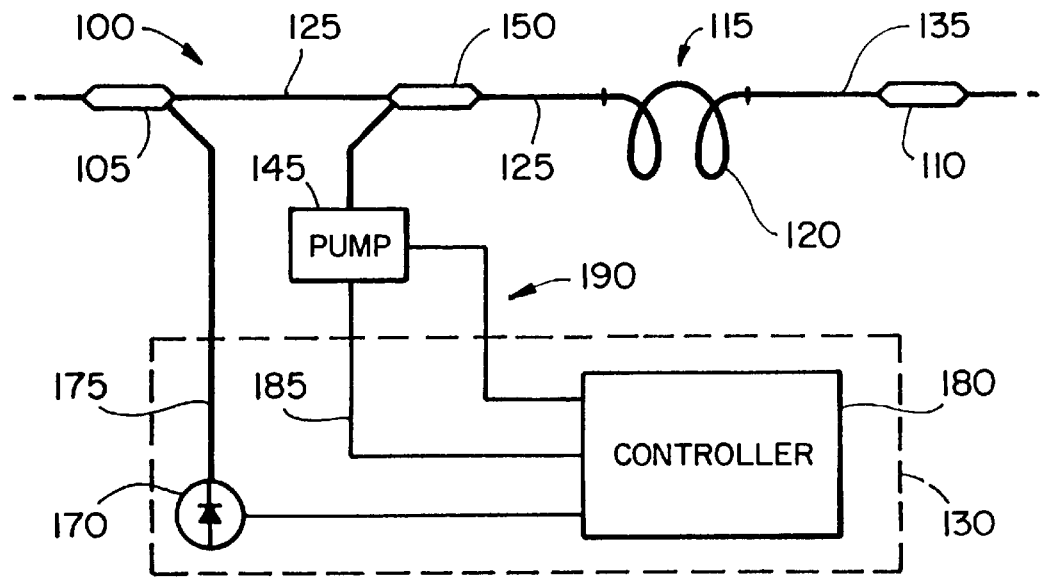
FIG_2

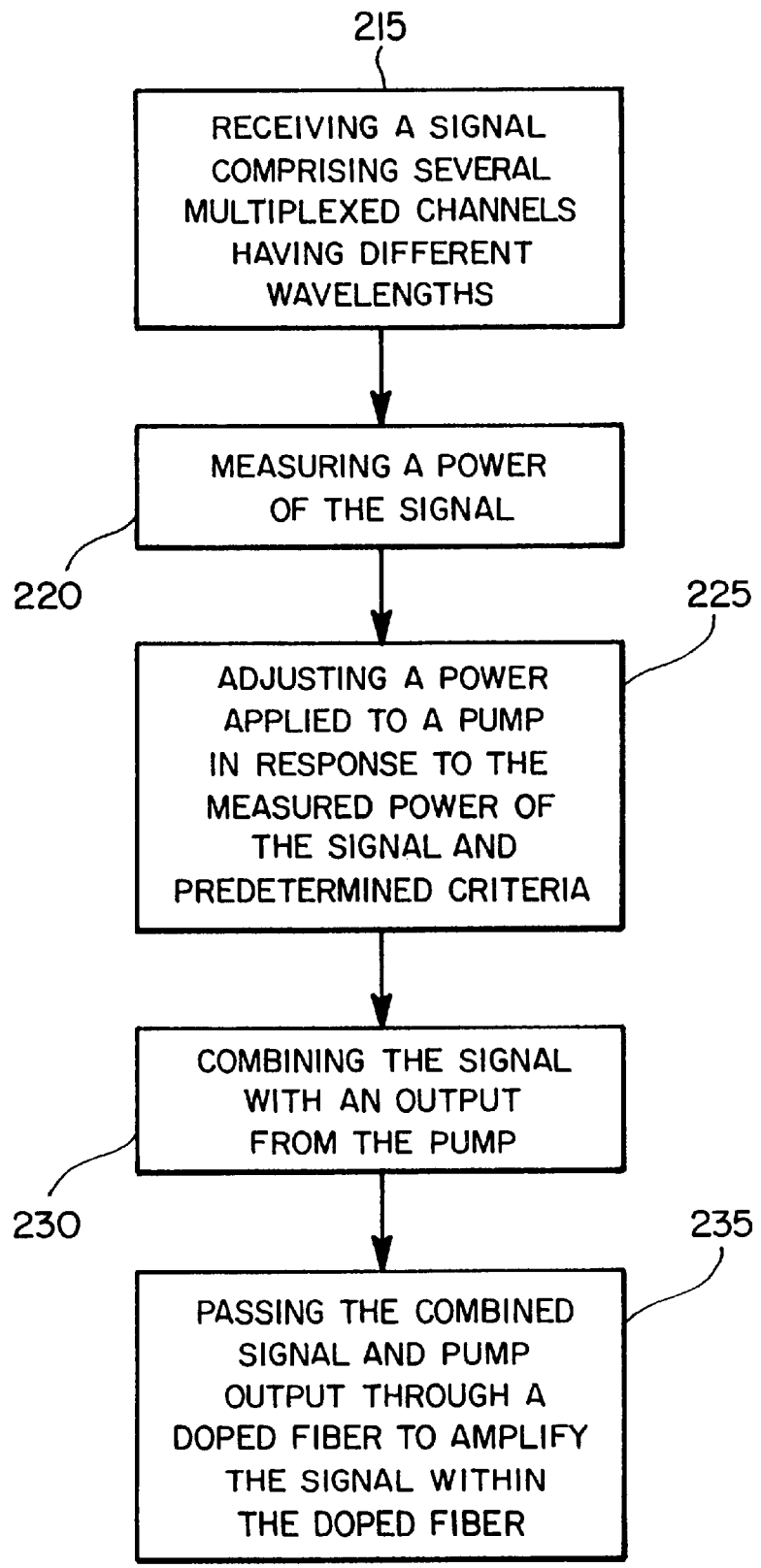
FIG_3

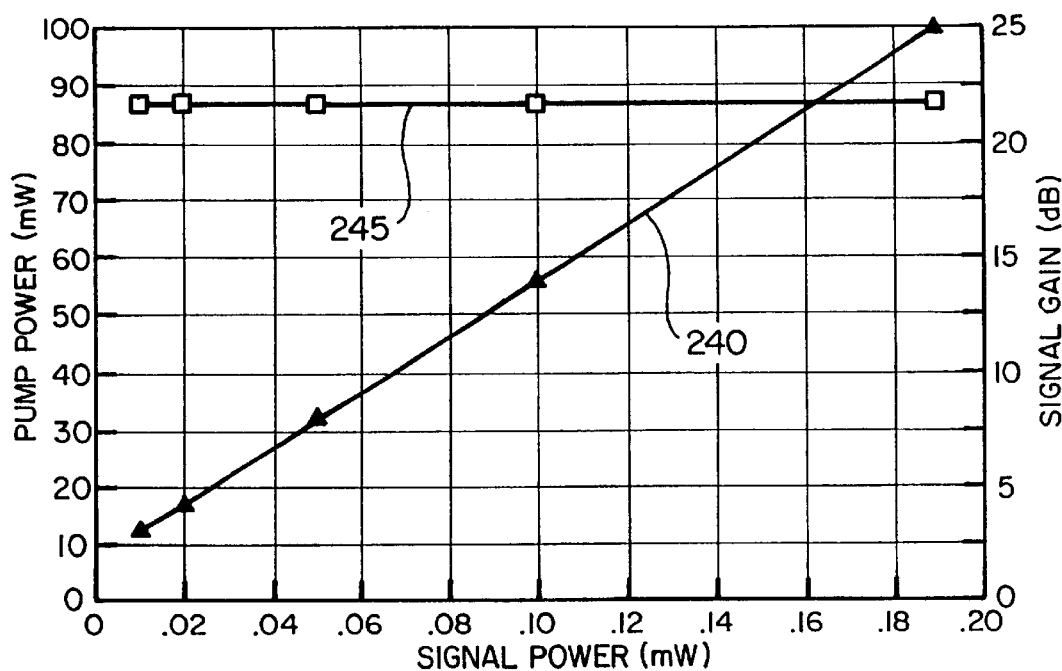
FIG_4
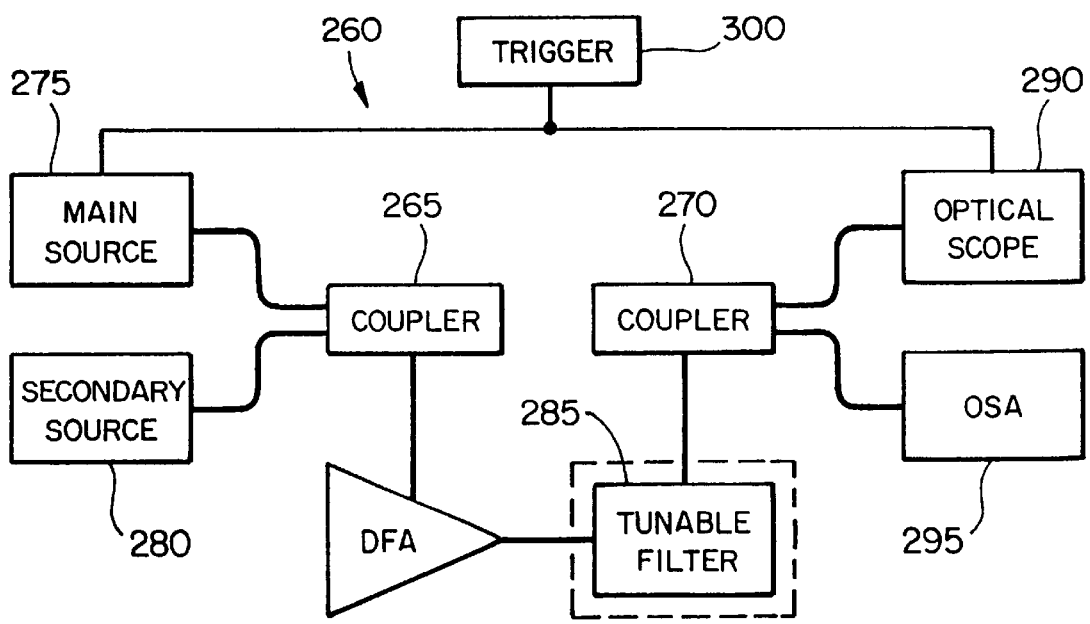
FIG_5

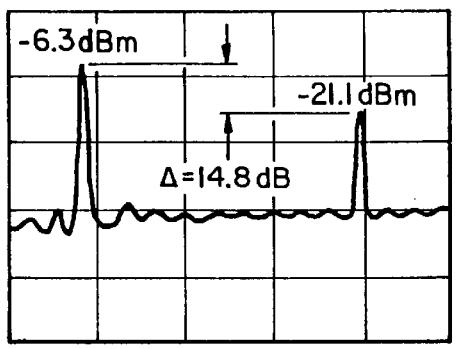
FIG_6A
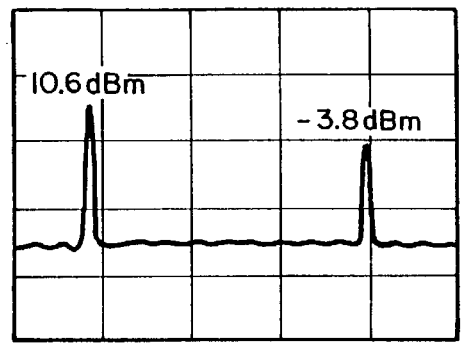
FIG_6B
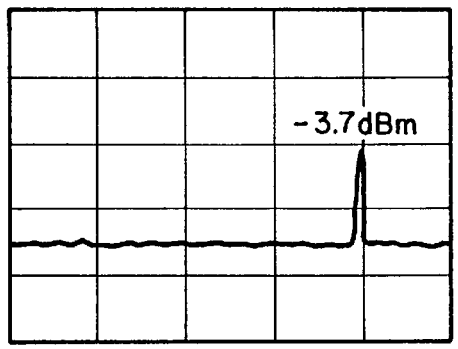
FIG_6C
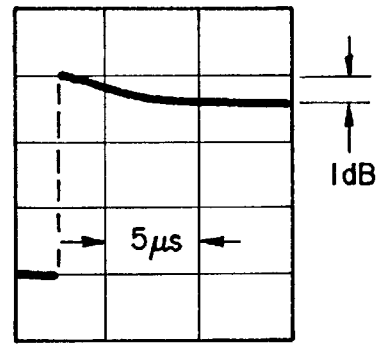
FIG_7A
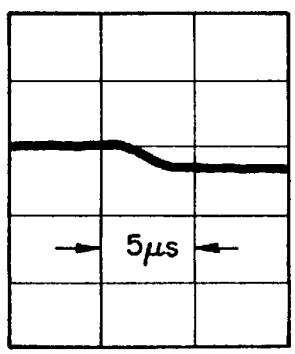
FIG_7B
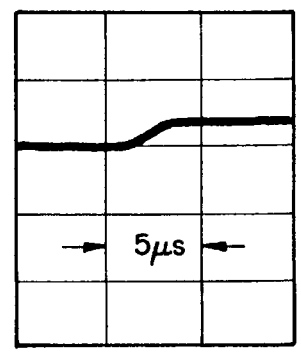
FIG_7C

2

FIBER AMPLIFIER WITH FAST TRANSIENT RESPONSE AND CONSTANT GAIN

FIELD OF THE INVENTION

The present invention relates generally to the field of fiber optic communication systems and more particularly to amplification of one or more multiplexed channels of different wavelengths carried simultaneously on a single fiber.

BACKGROUND OF THE INVENTION

Optical amplifiers are widely used in fiber communication systems and enable the transmission of optical signals over thousands of kilometers. An optical amplifier typically includes a light amplifying medium, such as a fiber doped with a rare-earth ion that has an unpaired electron, for example, an Erbium doped fiber. Not many dopant ions are needed, just a few for every thousand atoms of silica in the fiber. An optical source, such as a particular type of diode laser commonly known as a pump, operating at a 980 or 1480 nanometer wavelength (nm), excites ions in the doped fiber raising them from a base or ground state to an excited state. In this excited or laser-pumped state, the ions are poised to radiate a photon and return to the base state whenever another photon of the same resonant wavelength impinges on it. When a photon of an incoming signal impinges on an excited ion within the doped fiber the one incoming photon becomes two, stimulating further emissions of light from the excited ions and starting a photon chain reaction within the doped fiber. Thus, the intensity of the incoming signal is progressively increased along the length of the doped fiber, amplifying the signal. The total output power of the amplifier, and thus the amplification or gain of the signal, depends primarily on the energy of light injected by the pump, which in turn depends on the power applied to the pump.

The introduction in recent years of wavelength division multiplexing (WDM), a scheme in which several optical signals or channels are transmitted simultaneously over a single path has led to the development of optical amplifiers, known as WDM amplifiers, that can operate over wide range of wavelengths. Ideally, the WDM amplifier provides a constant gain for each optical channel whatever the total input power or number of channels present in the input signal. However, this will not occur if the WDM amplifier is operated in a constant output power mode or in a constant pump current mode. Assuming the WDM amplifier is in saturation the total output power changes little with varying levels of input power. Also assuming that each input channel is at the same power level, as the number of channels is increased, the total available power must be shared between the additional channels reducing the gain on each channel. Thus, for a WDM amplifier to maintain a constant gain, the pump power must be adjusted for changes in either the number of channels or the total input power. Such changes generally require a technician to increase power to the pump, add pumps or replace the existing pump with a larger one.

In the first generation of fiber communication systems using WDM, the number of channels remained fixed for long periods. Thus, only infrequently was it necessary to reconfigure the system to add additional channels or to remove existing channels. Accordingly, there was ample time to adjust the pump power to the appropriate levels.

However, in the latest generation of applications, such as optical switching, it is frequently necessary to add or drop channels. This means input power to the WDM amplifier changes dynamically, and to maintain a constant gain for an output signal the pump power must also be adjusted dynamically. Moreover, in a system having a dynamically changing input power the transient response of the WDM amplifier becomes much more important. Transient response is a measure of the how quickly and how closely the output signal tracks changes in the input power. The key parameters for transient response are settling time and overshoot. Settling time is the time it takes for the output power to reach steady state in response to a change in the input power. Overshoot is the amount by which the signal goes above the steady state level.

Several approaches to providing WDM amplifiers having a constant gain and a fast transient response have been tried. However, none of these approaches have been wholly satisfactory. A key factor that complicates the ability to maintain accurate gain control and a fast transient response is differentiating the power of the output signal from the total power at the output. This is because the light amplifying medium typically generates spontaneous emissions or optical noise, which can be significant portion of the total output power when compared with the power of the output signal. In other words, total output power is equal to signal power plus the spontaneous emissions from the light amplifying medium.

One conventional design for WDM amplifiers uses a control or feedback loop in which two detectors, one at the input to the amplifier and one at the output of the amplifier, are used to control the power applied to the pump to maintain a constant gain. One draw back to this approach is that the output detector cannot distinguish between the spontaneous emission and the signal power leading to poor control of the signal gain. Another draw back is that when the input power is zero the pump power is also zero. This typically leads to overshoot when channels are added resulting in a poor transient response.

Accordingly, there is a need for an optical amplifier that is capable of providing substantially equal and constant gain to each channel of a signal having one or more multiplexed channels of different wavelengths. It is also desirable that the amplifier is capable of automatically adjusting to provide substantially equal and constant gain to each channel when additional channels are added or existing channels are removed. It is further desirable that the amplifier can provide a fast transient response to changes in input power, such as when channels are added or are removed.

The present invention provides a solution to these and other problems, and offers other advantages over the prior art.

SUMMARY OF THE INVENTION

The present invention relates to an apparatus and method for amplifying an incoming signal having one or more multiplexed channels of different wavelengths carried simultaneously on a single fiber that solves these problems.

According to one embodiment, an optical amplifier is provided. The optical amplifier includes an input coupler for receiving an incoming signal to the amplifier, a doped fiber coupled to the input coupler, a pump coupled to the doped fiber to provide an output to amplify the incoming signal within the doped fiber and a control system for controlling the pump. The incoming signal is split by the input coupler with, for example, about 99% of the power of the incoming signal being transmitted from the input coupler to the doped fiber and about 1% being transmitted to the control system. The control system has an optical detector for measuring power of the incoming signal, and a controller for adjusting electrical power applied to the pump based on the measured power of the incoming signal and predetermined criteria. The controller adjusts the electrical power applied to the pump as a linear function of the power of the incoming signal by including within the predetermined criteria a multiplier by which the measured power of the incoming signal is multiplied. The predetermined criteria also include an offset that is added to the product of the multiplier and the signal power to ensure that the electrical power applied to the pump, and therefor the power of the output of the pump, is non-zero even for zero signal power. Preferably, the incoming signal is made up of a number of multiplexed channels having different wavelengths and the controller is capable of automatically adjusting electrical power to the pump to provide equal and constant gain to each channel when additional channels are added or existing channels are removed. More preferably, the controller can provide a transient response of less than 200 µs when channels are added or are removed.

In one version of this embodiment, the control system further includes a monitoring circuit for measuring the power of the output of the pump. This monitoring circuit can include either a second detector coupled to a coupler at the output of the pump or a facet monitor inside the pump. In this version, the electrical power applied to pump is adjusted so that the power of the output of the pump is equal to the sum of the product of the multiplier and the signal power and the offset.

In another aspect, the present invention is directed to a method of operating an optical amplifier to provide equal and constant gain to a signal made up of several multiplexed channels having different wavelengths. In the method, the amplifier receives the signal and measures the power of the signal. A controller adjusts electrical power applied to a pump based on the measured power of the signal and predetermined criteria. The signal is then combined with an output from the pump, and the combined signal and pump output passed through a doped fiber to amplify the signal. Preferably, the step of adjusting electrical power applied to the pump involves automatically adjusting power to provide equal and constant gain to each channel even when additional channels are added or existing channels are removed. More preferably, the electrical power applied to the pump is adjusted sufficiently fast to provide a transient response of less than 200 µs when channels are added or are removed.

In one version, the step of adjusting the electrical power to the pump involves adjusting the electrical power applied to the pump as a linear function of the power of the incoming signal. Generally, the predetermined criteria include a multiplier, and the step of adjusting the electrical power to the pump involves multiplying the power of the incoming signal by the multiplier. The predetermined criteria can further include an offset that is added to the product of the multiplier and the signal power so that the electrical power applied to the pump, and therefor the power of the output of the pump, is non-zero even for zero signal power.

In yet another aspect, the present invention is directed to an optical amplifier for use in a fiber communication system that can provide equal and constant gain to each channel in a signal having several channels. The amplifier includes a light amplifying medium connected to an input coupler to amplify the signal, an excitation light source coupled to the light amplifying medium to amplify a signal within the light amplifying medium, and control means for controlling the excitation light source. Generally, the control means includes means for measuring power of the incoming signal, and means for adjusting electrical power to the excitation light source based on the measured power of the signal and predetermined criteria. Preferably, the control means can automatically adjust power to the excitation light source to provide equal and constant gain to each channel even when additional channels are added or existing channels are removed. More preferably, the control means can provide a transient response of less than 200 µs when channels are added or are removed.

BRIEF DESCRIPTION OF THE DRAWINGS

These and various other features and advantages of the present invention will be apparent upon reading of the following detailed description in conjunction with the accompanying drawings, where:

FIG. 1 is a schematic of an embodiment of an amplifier according to the present invention;

FIG. 2 is a schematic of another embodiment of an amplifier according to the present invention;

FIG. 3 is a flowchart showing an embodiment of a method of operating an amplifier according to the present invention;

FIG. 4 is a graph illustrating pump power increasing as a function of signal power and a graph illustrating a substantially constant gain of an amplifier according to an embodiment of the present invention;

FIG. 5 is a schematic of a setup for testing response time and gain of an amplifier according to an embodiment of the present invention;

FIGS. 6A to 6C are graphs of an input and steady state spectral responses from the test setup of FIG. 5; and FIGS. 7A to 7C are graphs of transient responses from the test setup of FIG. 5.

DETAILED DESCRIPTION

The present invention provides an apparatus and method for amplifying a signal comprising one or more multiplexed channels of different wavelengths. The apparatus and method according to the present invention are particularly advantageous for use in fiber optic communication systems. A schematic of an exemplary optical amplifier according to an embodiment of the present invention is shown in FIG. 1. The particular embodiment of the optical amplifier shown herein is provided only to illustrate the invention and should not be used to limit the scope of the invention.

Referring to FIG. 1, the amplifier 100 generally includes an input coupler 105 for receiving an incoming signal to the amplifier, an output coupler 110 for transmitting the amplified signal from the amplifier, and a light amplifying medium 115, such as a doped fiber 120, disposed therebetween. In operation, the incoming signal is split by the input coupler 105 with, for example, about 99% of the power of the incoming signal being transmitted from the input coupler to the light amplifying medium 115 via a fiber 125, and about 1% being transmitted to a control system 130 described infra. The amplified signal is transmitted from the light amplifying medium 115 to the output coupler 110 via another fiber 135. An excitation light source, such as a particular type of diode laser, commonly known as a pump 145 provides an excitation light or output that excites ions (not shown) in the light amplifying medium 115 raising them from a base or ground state to an excited state. The output from the pump 145 is coupled to the light amplifying medium 115 through a multiplexing coupler or combiner 150 that combines the output of the pump with the signal and transmits the combined signal/output to the light amplifying medium 115. In the light amplifying medium 115, the ions are raised to an excited state by the output of the pump 145, and the signal applied to the light amplifying medium impinges on the excited ions within the doped fiber stimulating emission of light from the excited ions and causing transition of the ions from the excited state to the base state. The emitted light stimulates further emissions, progressively increasing the intensity of the incoming signal as the signal is propagated within the light amplifying medium 115, thereby amplifying the signal.

In accordance with the present invention, the amplifier 100 also includes a control system 130 for controlling the pump 145 to provide a constant gain and fast transient response. The control system 130 generally includes an optical detector 170 coupled to the input coupler 105 via a fiber 175 to measure the power of the incoming signal, and a controller 180 capable of adjusting electrical power applied to the pump 145 via electric line 185 in response to the incoming signal. The optical detector 170 is a photo-sensitive device, such as a photo-diode or photo-transistor, that is electrically connected to the controller 180. The controller 180 typically includes analog or digital control circuitry or logic (not shown) for adjusting electrical power applied to the pump 145 and thereby adjusting the power of the output from the pump.

Generally, the electrical power applied to the pump 145 is adjusted so that the output power of the pump varies as a linear function of the measured power of the incoming signal. In one embodiment, this is accomplished by calculating the desired pump output power based on the measured power of the incoming signal and other predetermined criteria, and adjusting the electrical power to the pump 145 accordingly. The predetermined criteria typically includes a multiplier by which the measured power of the incoming signal is multiplied, and an offset that is added to the product of the multiplier and the signal power. The offset ensures that the electrical power applied to the pump 145, and therefor the power of the output of the pump, is non-zero even for zero signal power, thereby substantially reducing if not eliminating overshoot and providing a fast response time. Preferably, the control system 130 is capable of automatically adjusting electrical power to the pump 145 to provide substantially equal and constant gain to each channel of a signal comprising a number of multiplexed channels each with a different wavelength, even when additional channels are added or existing channels are removed. More preferably, the control system 130 is capable of providing a fast transient response of less than 200 μs when the power of the incoming signal is changed, for example when channels are added or removed from the signal.

Optionally, the control system 130 can further include a monitoring circuit 190 adapted to measure the power of output from the pump 145 to verify that it corresponds to the electrical power applied by the controller 180. This is necessary because the output from the pump 145 can vary over time. In particular, for a given input electrical power the power of the output from the pump 145 will generally decrease as it ages. In a preferred embodiment the controller 180 determines the desired pump output power by calculating the sum of the offset and the product of the multiplier and the signal power, and adjusts the electrical power to the pump 145 to provide the required output power, thereby automatically compensating for degradation of the pump output power. As shown in FIG. 1, the monitoring circuit includes a second optical detector 195 coupled via a fiber 200 to a splitter or coupler 205, similar to the input coupler 105 described above, at the output of the pump 145. Alternatively, as shown in FIG. 2, the monitoring circuit 190 can include a facet monitor (not shown) that is internal to the pump 145, and which is directly electrically connected to the controller 180. A facet monitor is a photosensor, such as a photodiode, positioned inside the pump between 2 and 4 mm from either a front facet or a back facet of the laser to receive light emitted therefrom. The facet monitor converts the light received into a corresponding electrical signal which is then coupled directly to the controller 180.

A method of operating an optical amplifier 100 to provide constant gain and fast transient response according to the present invention will now be described with reference to FIG. 3. FIG. 3 is a flowchart showing an embodiment of a method for operating an amplifier to provide fast transient response and substantially equal and constant gain to each channel of a signal having a number of multiplexed channels of different wavelengths. In a first step (step 215) the incoming signal is received by the input coupler 105 and, in a measuring step (step 220), the power of the signal is measured. The electrical power applied to the pump 145 is then adjusted (step 225) in response to the measured signal and predetermined criteria. The output from the pump 145 is combined with the incoming signal (step 230) and the passed through the light amplifying medium 115 thus amplifying the signal (step 235).

EXAMPLES

The following examples are provided to illustrate advantages of certain embodiments of the present invention, and are not intended to limit the scope of the invention in any way.

In a first example a signal with a power increasing from 0.01 mW (−20 dBm) to 0.19 mW (−7.2 dBm) was applied to the amplifier 100 shown in FIG. 1. The electrical power applied by the control system 130 to the pump 145 was determined by calculating the necessary pump output power using the following equation:

$$P_p(mW) = L_M \times P_s(mW) + O_S(mW)$$

where $P_p$ is the pump output power, $P_s$ is the measured signal power, $L_M$ is the multiplier and is equal to 480.75, and $O_S$ is the offset and is equal to 8.25. Referring to FIG. 4, line 240 represents the pump output power and line 245 represents the gain of the output signal from the amplifier 100 as measured at the output coupler 110 using a spectrum analyzer. As illustrated by FIG. 4 the signal gain remains constant at 21 dB within ±0.1 dB over the entire range of input signal power.

A schematic of a setup 260 for testing response time and gain of an amplifier 100 in a second example is shown in FIG. 5. Referring to FIG. 5, the test setup 260 included an amplifier 100 according to the present invention, two multiplexing couplers 265, 270, at the input and output of the amplifier, a main source 275, a secondary source 280, a tunable filter 285, an optical scope 290, an optical spectrum analyzer 295 and a trigger 300.

In this e)(ample, the main source 275 generated a main channel or signal having a wavelength of 1547.5 nm at −6.3 dBm, and the secondary source 280 generated a second signal having a wavelength of 1556.9 nm at −21.1 dBm. These signals were combined in the first multiplexing coupler 265 to form the input shown in FIG. 6A. The signals were applied to the amplifier 100 and the output from the amplifier, shown in FIG. 6B, and the steady state response analyzed and measured using the optical spectrum analyzer 295. The average gain for both signals was about 17.1 dB, with the main signal having an output power of about 10.6 dBm and the secondary signal having an output power of about 3.8 dBm. Next, the main signal was dropped and the steady state response for the secondary signal re-measured. As shown in FIG. 6C, the output power of the secondary signal remained substantially constant regardless of whether the main signal is switched on or off.

In a third example, the results of which are shown in FIGS. 7A to 7C, the above of events were repeated and the output analyzed using the tunable filter 285 and the optical scope 290 to illustrate the fast transient response time of the amplifier 100. FIG. 7A shows a slight overshoot of approximately 1 dB when the main signal is switched on but this settles to within 10% of the steady state response well within 10 $\mu$s. The switching off of the main signal (not shown) was nearly instantaneous with the settling time well below 1 $\mu$s. FIGS. 7B and 7A illustrate the effect on the secondary signal when the main signal is turned off and on respectively. Note that in both events the maximum change in the secondary signal is slight, less than 0.3 dB, and the transient response is well within 5 $\mu$s. Thus, these examples demonstrate the ability of an amplifier according to the present invention to provide substantially equal and constant gain to each of a number of channels of an input signal, and a fast transient response when the power of the incoming signal is changed.

Because unlike conventional WDM amplifiers, the electrical power applied to the pump 145 is solely a function of the power of the incoming signal and the not of the power out of the light amplifying medium 115 spontaneous emission does not affect performance of the amplifier 100 of the present invention.

It is to be understood that even though numerous characteristics and advantages of various embodiments of the present invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed.

What is claimed is:

1. An optical amplifier comprising:
   an input coupler capable of receiving an incoming signal to the amplifier;
   an output coupler capable of outputting an outgoing signal;
   a doped fiber coupled between the input coupler and the output coupler;
   a pump coupled to the doped fiber to provide an output to the doped fiber to amplify the incoming signal within the doped fiber; and
   a control system comprising an optical detector to measure power of the incoming signal, and a controller configured to adjust power applied to the pump in response to the measured power of the incoming signal and predetermined criteria, and independent of a measured power of the outgoing signal from the amplifier.

2. An optical amplifier according to claim 1 wherein the incoming signal comprises a plurality of multiplexed channels having different wavelengths, and wherein the controller is configured to adjust the power applied to the pump to provide substantially equal and constant gain to each of the plurality of channels.

3. An optical amplifier according to claim 2 wherein the controller is capable of automatically adjusting power to the pump to provide substantially equal and constant gain to each of the plurality of channels when additional channels are added or existing channels are removed.

4. An optical amplifier according to claim 2 wherein the controller is capable of providing a transient response of less than 200 $\mu$s when channels are added or are removed.

5. An optical amplifier according to claim 1 wherein the predetermined criteria includes a multiplier by which the power of the incoming signal is multiplied.

6. An optical amplifier according to claim 1 wherein the predetermined criteria includes an offset such that the power applied to the pump is non-zero for zero signal power.

7. An optical amplifier according to claim 1 wherein the control system further comprises a monitoring circuit adapted to measure the output of the pump.

8. An optical amplifier according to claim 7 wherein the monitoring circuit comprises a facet monitor inside the pump.

9. An optical amplifier according to claim 7 wherein the monitoring circuit comprises a second detector coupled to a coupler at an output of the pump.

10. A method of operating an optical amplifier, the method comprising steps of:
    (a) receiving an incoming signal to the amplifier, the incoming signal comprising a plurality of multiplexed channels having different wavelengths;
    (b) measuring a power of the incoming signal;
    (c) adjusting a power applied to a pump in response to the measured power of the incoming signal and predetermined criteria, and independent of a measured power of an outgoing signal from the amplifier;
    (d) combining the incoming signal with an output from the pump; and
    (e) passing the combined incoming signal and pump output through a doped fiber to amplify the incoming signal within the doped fiber,
    whereby a substantially equal and constant gain is provided to each of the plurality of channels.

11. A method according to claim 10 wherein step (c) comprises the step of automatically adjusting power applied to the pump to provide substantially equal and constant gain to each of the plurality of channels when additional channels are added or existing channels are removed.

12. A method according to claim 11 wherein step (c) comprises the step of adjusting power applied to the pump to provide a transient response of less than 200 $\mu$s when channels are added or are removed.

13. A method according to claim 10 wherein step (c) comprises the step of adjusting power applied to the pump as a linear function of the power of the incoming signal.

14. A method according to claim 10 wherein step (c) comprises the steps of:
    (i) calculating a pump output power based on the measured power of the incoming signal and predetermined criteria; and
    (ii) adjusting the power applied to a pump to provide the calculated pump output power.

15. A method according to claim 14 wherein step (c) further comprises the step of measuring pump output power.

16. A method according to claim 14 wherein the predetermined criteria includes a multiplier, and wherein step (c)(i) comprises the step of calculating a pump output power by multiplying the power of the incoming signal by the multiplier.

17. A method according to claim 16 wherein the predetermined criteria includes an offset, and wherein step (c)(i) comprises the step of calculating a pump output power by adding an offset to a product of the multiplier and the signal power.

18. An optical amplifier for use in a fiber communication system, the amplifier comprising:

an input coupler for receiving an incoming signal to the amplifier, the incoming signal comprising a plurality of multiplexed channels having different wavelengths;

an output coupler capable of outputting an outgoing signal;

a light amplifying medium connected to the input coupler to amplify the incoming signal;

an excitation light source coupled to the light amplifying medium to amplify the incoming signal within the light amplifying medium; and control means for controlling the excitation light source to provide substantially equal and constant gain to each of the plurality of multiplexed channels of the incoming signal independent of a measured power of the outgoing signal from the amplifier, the control means comprising means for measuring power of the incoming signal, and means for adjusting power to the excitation light source in response to the measured power of the incoming signal and predetermined criteria.

19. An optical amplifier according to claim 18 wherein the control means for controlling the excitation light source further comprises a monitoring circuit adapted to measure the output of the excitation light source.

20. An optical amplifier according to claim 19 wherein the predetermined criteria includes the following equation:

$$P_p = L_M \times P_s + O_s$$

where $P_p$ is power to the excitation light source, $P_s$ is the measured power of the incoming signal, $L_M$ is a multiplier by which the power of the incoming signal is multiplied, and $O_s$ is an offset.

* * * * *